United States Patent [19]
Scheiber

[11] Patent Number: 5,670,877
[45] Date of Patent: Sep. 23, 1997

[54] SHAFT ROTATION SENSOR WITH MAGNETIC SENSORS ANGULARLY SPACED APART WITH RESPECT TO A MAGNETIC SOURCE

[75] Inventor: Donald J. Scheiber, Columbia City, Ind.

[73] Assignee: Hughes Electronics, Los Angeles, Calif.

[21] Appl. No.: 349,279

[22] Filed: Dec. 5, 1994

[51] Int. Cl.⁶ .............. G01B 7/30; G01P 3/487; B60T 8/32
[52] U.S. Cl. .............. 324/207.25; 324/207.16; 324/174; 188/181 R
[58] Field of Search ............... 324/163, 166, 324/173, 174, 207.15, 207.16, 207.17, 207.2, 207.21, 207.23, 207.24, 207.25, 253, 254, 255, 244, 247; 310/156, 168; 188/181 R

[56] References Cited

U.S. PATENT DOCUMENTS

| | | | |
|---|---|---|---|
| 3,728,565 | 4/1973 | O'Callaghan | 324/165 |
| 3,731,752 | 5/1973 | Schad | 324/247 |
| 4,159,644 | 7/1979 | Svala | 324/174 X |
| 4,181,884 | 1/1980 | Shirasaki et al. | 324/207.25 |
| 4,283,679 | 8/1981 | Ito et al. | 324/207.21 X |
| 4,370,614 | 1/1983 | Kawada et al. | 324/165 |
| 4,490,674 | 12/1984 | Ito | 324/207.21 X |
| 4,626,781 | 12/1986 | Forkel | 324/174 |
| 4,646,011 | 2/1987 | Wallrafen | 324/207.25 |
| 4,791,366 | 12/1988 | Suzuki et al. | 324/207.25 |
| 5,130,650 | 7/1992 | Lemarquand | 324/207.25 |
| 5,160,918 | 11/1992 | Saposnik et al. | 324/207.2 X |
| 5,252,919 | 10/1993 | Uemura | 324/207.17 X |
| 5,270,648 | 12/1993 | Watson | 324/253 |
| 5,331,276 | 7/1994 | Polvani et al. | 324/160 |
| 5,486,759 | 1/1996 | Seiler et al. | 324/207.25 |

FOREIGN PATENT DOCUMENTS 04141374  10/1991  Germany ............... 324/162

Primary Examiner—Sandra L. O'Shea
Assistant Examiner—Jay M. Patidar
Attorney, Agent, or Firm—Gordon R. Lindeen, III; Michael W. Sales; Wanda K. Denson-Low

[57] ABSTRACT

Shaft rotation sensor, including: two directional magnetic sensors disposed with respect rotating magnetic source, to sense magnetic field vector component generated by magnetic source; the magnetic sensors being disposed to provide output signals, having a sine/cosine relationship, representing magnitude of magnetic field vector component. In another aspect of the invention, a shaft rotation sensor, including: first and second directional magnetic sensors disposed with respect to rotating magnetic source, such that first sensor senses, and provides first output representing, magnitude of first magnetic field component and second sensor senses, and provides second output representing, magnitude of second magnetic field component orthogonal to first magnetic field component; and first and second outputs being electrically connected in series to provide first output channel. First sensor also senses, and provides third output representing, magnitude of second magnetic field component, and second sensor also senses, and provides fourth output representing, magnitude of first magnetic field component; and third and fourth outputs being electrically connected in series to provide second output channel having output orthogonal to output of first output channel. In this latter aspect, the sensor provides rotation sensor which is immune to uniform external magnet field.

8 Claims, 6 Drawing Sheets

SHAFT ROTATION SENSOR WITH MAGNETIC SENSORS ANGULARLY SPACED APART WITH RESPECT TO A MAGNETIC SOURCE

CROSS-REFERENCE TO RELATED APPLICATIONS

The present application is related to U.S. patent application Ser. No. 08/242,156, filed May 13, 1994, abandoned, which is a continuation-in-part of U.S. patent application Ser. No. 08/005,318, abandoned, both assigned to the assignee of the present invention, the disclosures of which are incorporated by reference hereinto.

BACKGROUND OF THE INVENTION

1. Field of the Invention

The present invention relates to sensing shaft rotation generally and, more particularly, but not by way of limitation, to novel method and apparatus for sensing shaft rotation using orthogonally placed directional magnetic sensors.

2. Background Art

There are a number of known devices for measuring angular position, rotational speed, and/or acceleration of a rotating member. These are useful in many applications and, recently, have been employed in antiskid brake systems (ABS) and for vehicular traction control.

Most ABS systems in use today rely upon passive variable reluctance sensing elements disposed in proximity to a toothed iron wheel to detect the speed of rotation of a wheel or drive shaft. Such devices suffer from two primary disadvantages: (1) the output signal of the sensing device degrades unless a close tolerance is kept between the sensor and the toothed wheel, and (2) the amplitude of the output signal decreases as the rotational speed decreases. The former disadvantage results in high manufacturing cost and susceptibility to minor dislocations between the sensor and the toothed wheel, leading to reliability problems. The second disadvantage renders this type of device of limited utility at low speeds. A complicated arrangement of sensors and wheel teeth must be employed if absolute angular position information is to be derived therefrom.

The inventions described in the above-referenced applications overcome the above disadvantages by providing, in one embodiment, method and apparatus for determining the angular position, rotational speed, and/or acceleration of a rotatable member, which includes providing on the rotatable member an annular magnetic source generating tangential, radial, and axial magnetic flux field components; detecting, with a directional magnetometer having a toroidal core and two secondary output windings thereon, at a location axially spaced from the magnetic source, in proximity to the magnetic source, the amplitude(s) and/or change of amplitude(s) of one or more of the magnetic flux field components, and providing outputs indicative thereof; modifying the sensor system to obtain orthogonal components and to equalize measured peak amplitudes of the magnetic flux components and/or to compensate for environmental distortion thereof, by one of more methods selected from the group consisting of: (1) orienting the toroidal core such that it lies in a plane at an angle between the plane of the annular magnetic source and a plane perpendicular to the plane of the annular magnetic source, (2) providing the secondary output windings with unequal numbers of turns, and (3) attenuating one of the outputs; and determining from the outputs the angular position, rotational speed, and/or acceleration of the rotatable member.

In applying the inventions described in the above-referenced applications to the sensing of rotation of shafts such as the sensing of rotation of a truck axle in the rear axle housing of the truck, it has been found that the earth's magnetic field penetrates down the length of the axle housing, causing the calibration of the sensor to change with the truck's geomagnetic orientation. Also, use of orthogonal magnetometer sensing coils on a single toroid required that two magnetic field components (radial and tangential, for example) be orthogonal with rotation, providing nearly ideal sine and cosine functions of the rotation angle. It proves to be difficult to maintain this condition over a broad range of installation conditions.

Accordingly, it is a principal object of the present invention to provide method and apparatus for sensing rotation of shafts which are insensitive to interfering magnetic fields such as, for example, that resulting from a homogeneous, interfering, magnetic field.

It is an additional object of the invention to provide such method and apparatus in which shaft rotation angle is determined with equal amplitude sine and cosine functions of the shaft rotation angle using the same magnetic field component (radial, tangential, axial, or any combination thereof) from an attached dipolar magnetic source.

It is another object of the invention to provide such method and apparatus that may be applied to sensing the rotation of a truck axle in the rear axle housing of the truck.

It is a further object of the invention to provide such method and apparatus which are economically and easily employed.

Other objects of the present invention, as well as particular features, elements, and advantages thereof, will be elucidated in, or be apparent from, the following description and the accompanying drawing figures.

SUMMARY OF THE INVENTION

The present invention achieves the above objects, among others, by providing, in one preferred embodiment, a shaft rotation sensor, comprising: two directional magnetic sensors disposed with respect to a magnetic source on a rotating member, such as to sense a magnetic field vector component generated by said magnetic source; and said magnetic sensors being disposed so as to provide output signals representing the magnitude of said magnetic field vector component, said output signals having a sine/cosine relationship. In another aspect of the invention, there is provided a shaft rotation sensor, comprising: first and second directional magnetic sensors disposed with respect to a magnetic source on a rotating member, such that said first sensor senses, and provides a first output representing, the magnitude of a first magnetic field component and said second sensor senses, and provides a second output representing, the magnitude of a second magnetic field component orthogonal to said first magnetic field component; and said first and second outputs being electrically connected in series to provide a first output channel; said first sensor also senses, and provides a third output representing, the magnitude of said second magnetic field component, and said second sensor also senses, and provides a fourth output representing, the magnitude of said first magnetic field component; and said third and fourth outputs being electrically connected in series to provide a second output channel having an output orthogonal to the output of said first output channel. In this latter aspect, the sensor provides a rotation sensor which is immune to a uniform external magnet field.

BRIEF DESCRIPTION OF THE DRAWING

Understanding of the present invention and the various aspects thereof will be facilitated by reference to the accompanying drawing figures, submitted for purposes of illustration only and not intended to define the scope of the invention, on which.

DETAILED DESCRIPTION OF THE PREFERRED EMBODIMENTS

Figure 1:
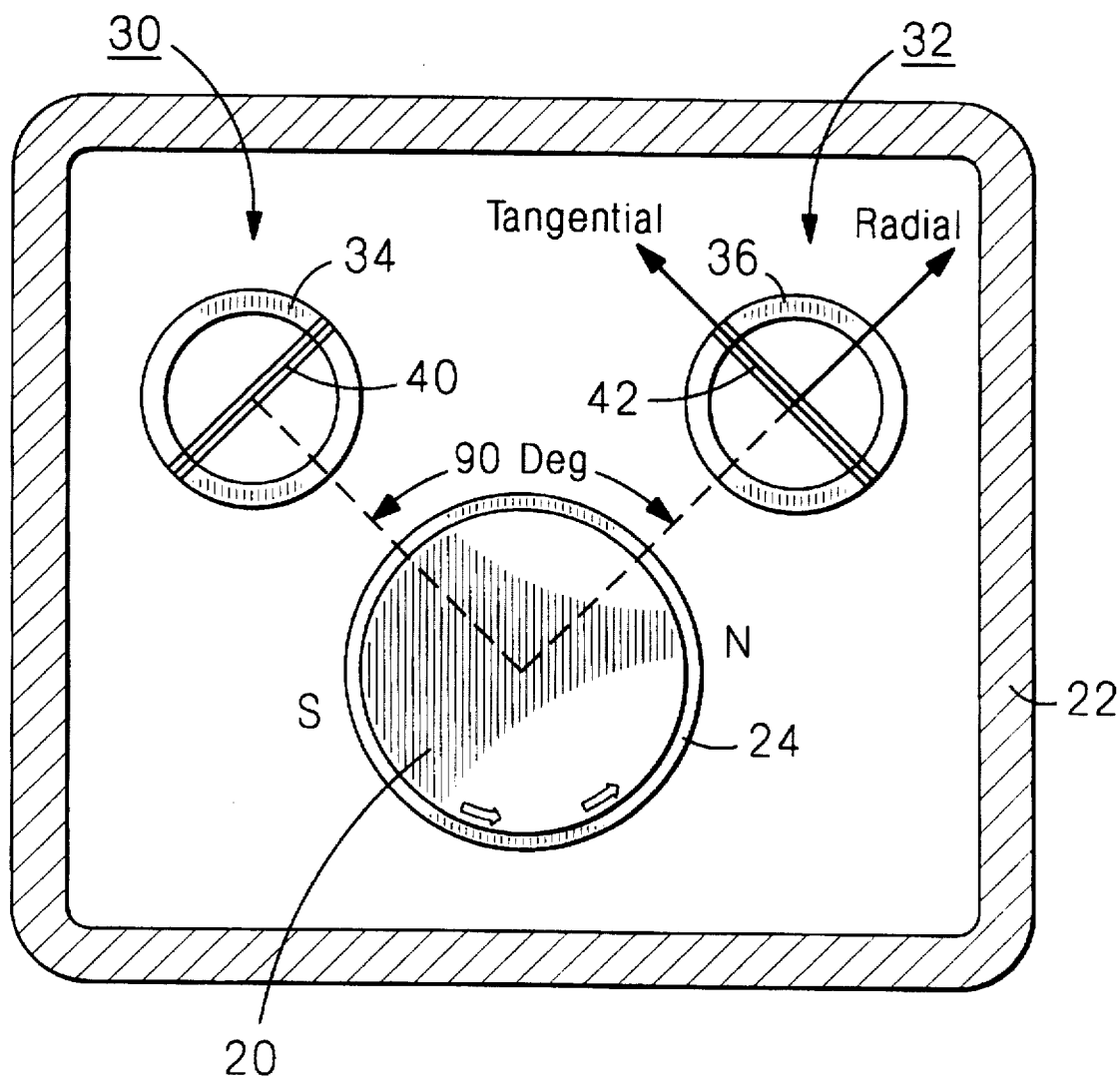
FIG. 1 is an end elevational view, partially in cross-section, of an apparatus, according to one embodiment of the present invention, for sensing rotation of an axle.

Reference should now be made to the drawing figures, on which similar or identical elements are given consistent identifying numerals throughout the various figures thereof, and on which parenthetical references to figure numbers direct the reader to the view(s) on which the element(s) being described is (are) best seen, although the element(s) may be seen also on other views.

Referring first to FIG. 1, there is illustrated a rotating horizontal axle 20 disposed within an axle housing 22. Axle 20 has a circumjacently disposed annular magnet 24 attached to the outer surface thereof. Disposed so as to sense the magnetic field generated by magnet 24 are first and second fluxgate magnetometers, generally indicated by the reference numerals 30 and 32, the magnetometers being represented, respectively, by their toroidal cores 34 and 36 and secondary windings 40 and 42. Secondary windings 40 and 42 are oriented with respect to magnet 24 such that they will sense primarily the radial magnetic field component produced by the magnet.

As illustrated on FIG. 1, magnetometers 30 and 32 are orthogonally displaced from each other with respect to the axis of axle 20. So arranged and with the primary windings (not shown) of magnetometers 30 and 32 connected in series, secondary windings 40 and 42 will output signals having a sine/cosine relationship, with equal peak amplitudes and zero crossings that are 90 degrees of axle rotation apart from each other, thus providing an indication of shaft position. These signals can be processed to provide rotational speed, angular direction, and/or acceleration of axle 20. Magnetometers 30 and 32 have nulls toward the ends of axle 20 and, therefore, discriminate against the horizontal component of the earth's magnetic field which may penetrate down the length of housing 22.

Figure 2:
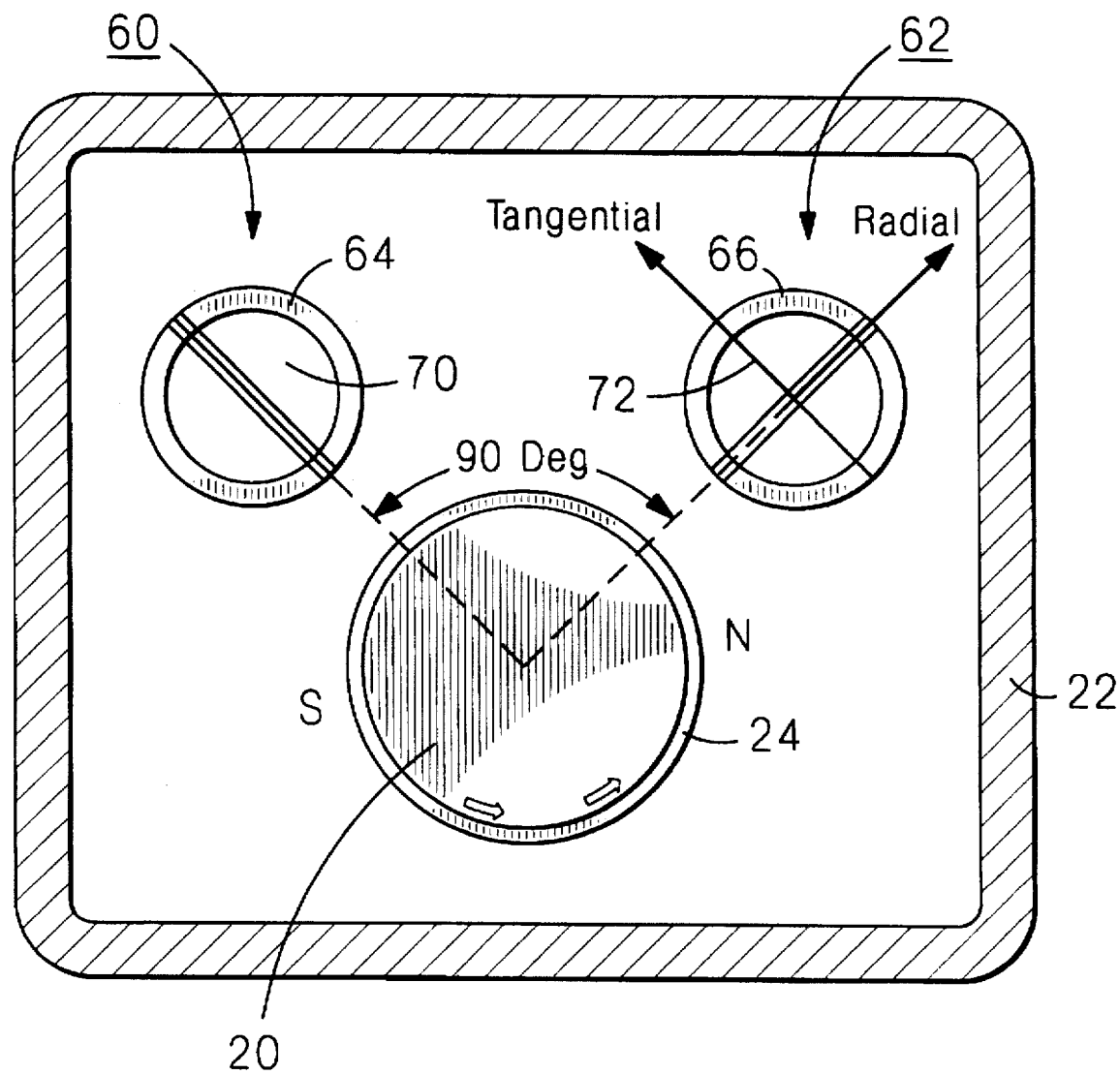
FIG. 2 is an end elevational view, partially in cross-section, of an apparatus, according to another embodiment of the present invention, for sensing rotation of an axle.

Referring now to FIG. 2, there is illustrated rotating axle 20, axle housing 22, and annular magnet 24 arranged as on FIG. 1. Disposed so as to sense the magnetic field generated by magnet 24 are first and second fluxgate magnetometers, generally indicated by the reference numerals 60 and 62, the magnetometers being represented, respectively, by their toroidal cores 64 and 66 and secondary windings 70 and 72. Secondary windings 70 and 72 are oriented with respect to magnet 24 such that they will sense primarily the tangential magnetic field component produced by the magnet.

As was the case with magnetometers 30 and 32 (FIG. 1), magnetometers 60 and 62 are orthogonally displaced from each other with respect to the axis of axle 20. So arranged and with the primary windings (not shown) of magnetometers 60 and 62 connected in series, secondary windings 70 and 72 will output signals having a sine/cosine relationship, thus providing an indication of shaft position. These signals can be processed to provide rotational speed, angular direction, and/or acceleration of axle 20. Magnetometers 60 and 62 also have a null toward the ends of axle 20 and, therefore, also discriminate against the horizontal component of the earth's magnetic field which may penetrate down the length of housing 22.

The present invention will also perform the intended purpose when the direction of sensitivity of the orthogonally placed magnetic sensors is at any arbitrary angle which produces the same combination of radial and tangential fields at the two sensor locations. In general, whatever the orientation of the sensitive axis at one sensor location, the proper location at the other orthogonal location can be generated by fixing the first sensor to the radius vector and sweeping the radius vector 90 degrees about the axis of rotation, to the new location, taking the sensor with it. This generally remains valid even in the case in which one orients the direction of sensitivity of the sensor in the axial direction and rotates the radius vector. In that case, the axial field will be monitored at both sensor locations and may equally well be utilized in sensing axle rotational angel and speed, within the intended scope of the present invention.

Thus, it can be seen that, in fact, any magnetic component from the rotating dipolar source can be used to determine axle orientation and speed. The requirement, and the essence of the present invention, is that the same magnetic component (the same relative to the radius vector to the sensor location, not in the absolute inertial sense) be monitored at two points which are 90 degrees of rotation separated from one another. This generates essentially the same field structure at the two points, but delayed in rotation by 90 degrees. Thus, if a sinusoidal output is seen at one location, a cosine function will appear at the other, and it is then a simple matter to determine angular orientation and speed.

Used in the manner described, observing the same field component at two orthogonal points, the amplitudes or the peak values of the two output channels will be very nearly the same, so that little or no amplitude adjustment need be made between the two output channels before they are used to determine the angular position and speed. The magnetic field component may be the tangential, radial, or axial field component or any combination of these.

The arrangements of the present invention illustrated on FIGS. 1 and 2, as noted, discriminate against the horizontal component of the earth's magnetic field. This is illustrated on FIG. 3 which shows very little deviation in sensor output when a horizontal axle, in its steel housing, is disposed in four different geomagnetic directions. The residual angular position error (difference between measured and actual axle angle) is due to many real world factors mostly attributable to asymmetries in the ring magnet source or in the steel (ferrous) structure in the vicinity, which affects the magnetic field from the ring magnet source. If excessive, this residual error can be corrected in each sensor installation since it is measurable and reproducible.

Figure 4:
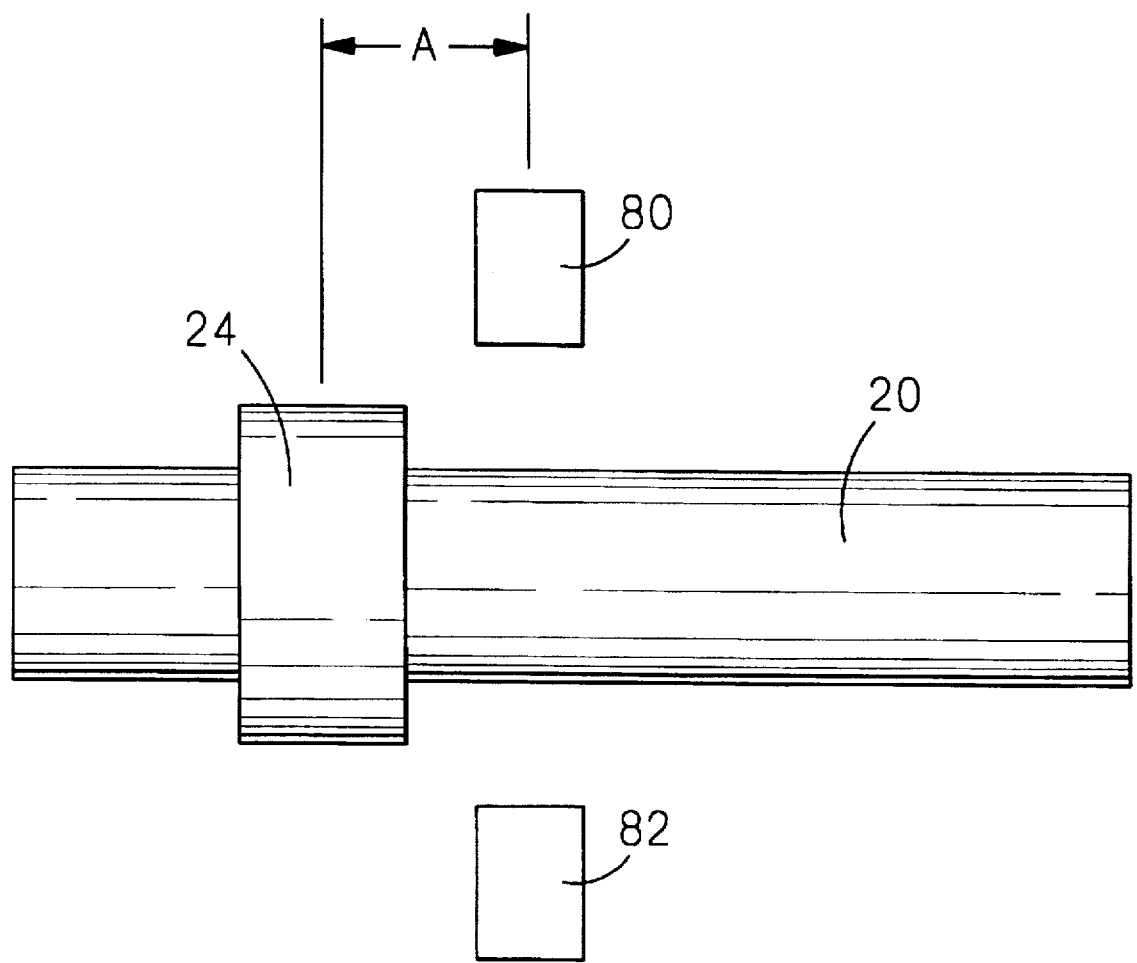
FIG. 4 is a top plan view of an apparatus according to the present invention.

Depending on the particular components and the environment, it may be found that peak performance is achieved when the toroidal cores 30 and 32 or 60 and 62 lie in the plane of magnet 24. In other cases, it may be found that peak performance is achieved when toroidal cores 30 and 32 or 60 and 62 lie in a plane displaced from the plane of magnet. The latter case is illustrated on FIG. 4 where the plane of exemplary sensors 80 and 82 is displaced from the plane of magnet 24 by the distance "A".

It is also possible to devise a rotational measurement device which operates with a multipoled magnetic source. In this case, an equal number of North and South poles are distributed alternately at equal intervals around the perimeter of the source. Two magnetic sensors are oriented to monitor either the magnetic radial or tangential or axial fields (or any desired combination) at points which are angularly separated by ½ the angular separation between adjacent North and South poles. If a quadrapolar source were employed (N-S-N-S), for example, then the polar separation is 90 degrees about the axle and the sensors should be displaced at a 45 degree angle (½ the polar angle) about the rotating shaft. In all cases, the same component of the rotating magnetic source must be monitored at the two locations. The angular rotation seen by the spaced detector will therefore be observed at a higher frequency than is seen from the dipolar like source. With a quadrapolar source, for example, the output would advance at an angular rate twice that from a dipolar source. This multipolar approach, while more complex, may be advantageous in certain applications.

The sensor configurations shown on FIGS. 1 and 2 discriminate against the axial component of an interfering magnetic field, since each toroidal magnetometer has a null in its directivity pattern which lies along the axis of the axle. These implementations are not of themselves immune to the adverse effects produced by field components which lie in the plane of the toroidal magnetometers. A steel housing itself can provide some shielding from this transverse component, but there are cases in which magnetic shielding may be impractical or too costly. In an alternative gradiometer variation of this invention, it is possible to discriminate against all stray, homogeneous, interfering magnetic fields, even those which fall in the plane of the toroidal cores.

In the gradiometer mode of operation described below, the tangential and radial sensing secondaries are both present on each toroid. The sets of orthogonal secondaries are interconnected in such a manner that the desired components from the magnetic source are reinforced while the effects of an interfering homogeneous field are cancelled.

Figure 5:
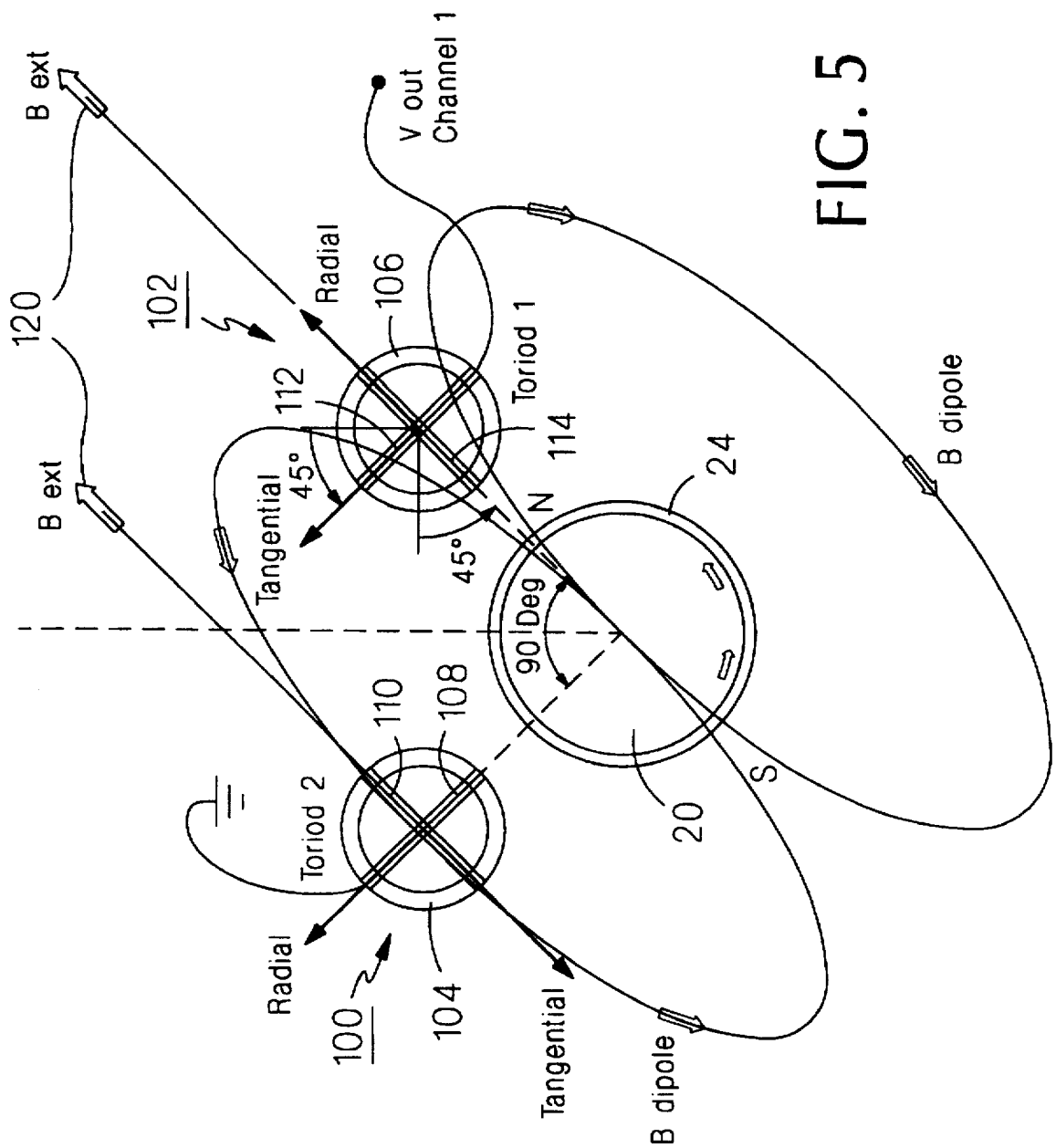
FIGS. 5 and 6 illustrate an embodiment of the present invention which cancels effects of a homogeneous, interfering, magnetic field.

Referring now to FIG. 5, there is illustrated rotating axle 20 with annular magnet 24 thereon. Disposed so as to sense the magnetic field generated by magnet 24 are first and second fluxgate magnetometers, generally indicated by the reference numerals 100 and 102, the magnetometers being represented, respectively, by their toroidal cores 104 and 106 and their secondary winding pairs 108/110 and 112/114, and being orthogonally displaced from each other with respect to the axis of axle 20. Secondary windings 108 and 114 are oriented with respect to magnet 24 such that those windings will sense the tangential component of the magnetic field produced by magnet 24. Likewise, secondary windings 110 and 112 are oriented with respect to magnet 24 such that those windings will sense the radial component of the magnetic field produced by magnet 24. A first channel is formed by the series connection of secondary windings 108 and 112.

When magnet 24 is in the attitude shown on FIG. 5, with the N pole of the magnet facing toward magnetometer 102, the field from the N pole passes through radial sensing winding 112 of that magnetometer and also through the tangential sensing secondary winding 108 of magnetometer 100. This produces a simultaneous output from each of secondary windings 108 and 112 which may then be electrically summed, as shown, to form the output of the first output channel. This channel will produce maximum output when the magnetic source is oriented as shown. Note that any component of an external, homogeneous, interfering field 120 will pass in a positive sense through secondary winding 112 and in a negative sense through secondary winding 108, thus cancelling any output due to this interfering field.

Figure 6:
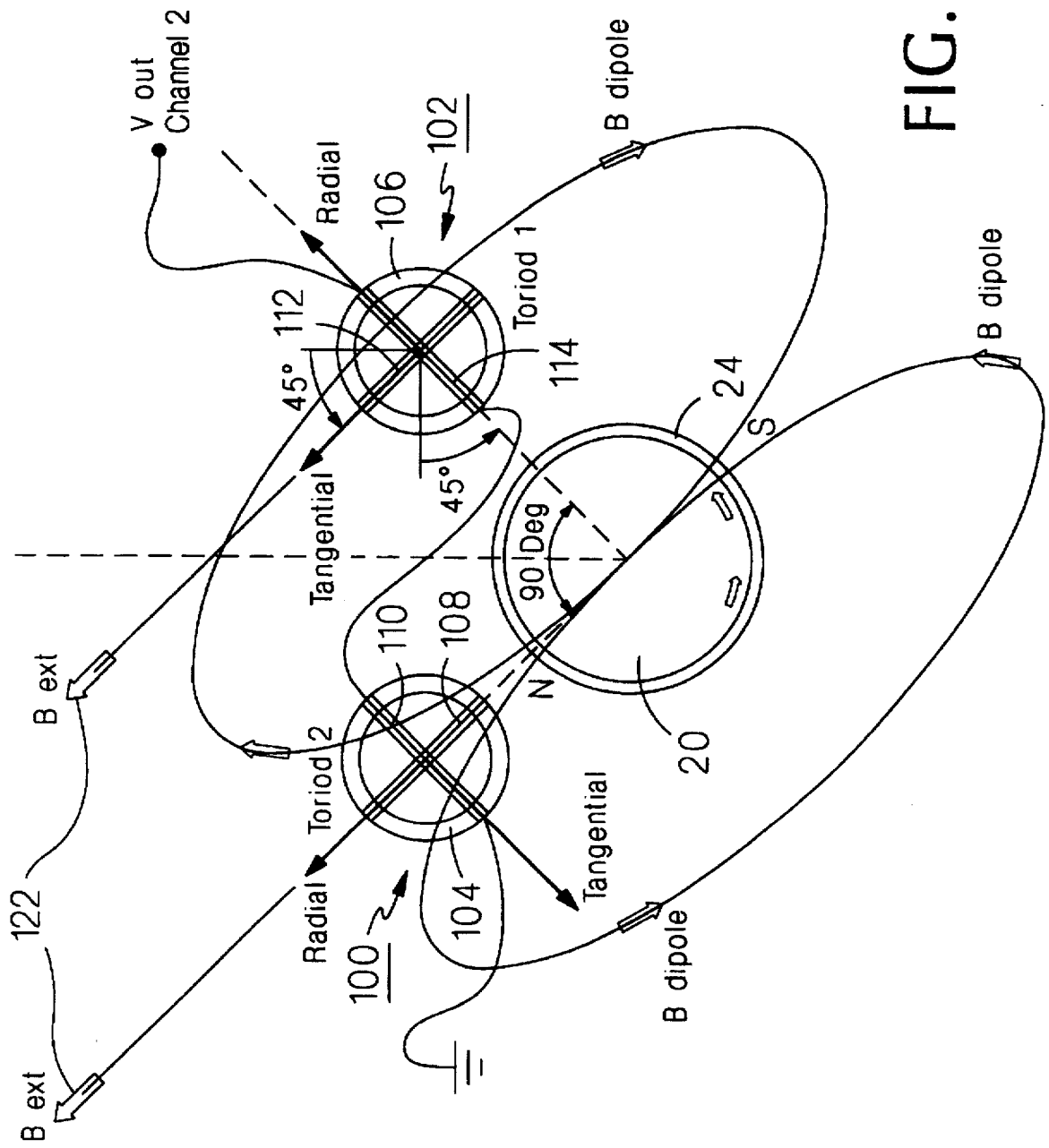

FIG. 6 shows the same arrangement of elements as shown on FIG. 5, except that magnet 24 is shown facing magnetometer 100 and secondary windings 110 and 114 are connected in series opposition to form a second output channel. With magnet 24 in the orientation shown, the magnetic field from the N pole of magnet 24 passes through tangential sensing secondary winding 114 of magnetometer 102 and also through radial sensing secondary winding 110 of magnetometer 100. This produces the output of the second channel which is at a peak when magnet 24 is oriented as shown. Note, as was the case with respect to the arrangement described with reference to FIG. 5, any component of an external, homogeneous, interfering field 122 which passes in a positive sense through radial sensing secondary winding 110 of magnetometer 100 will also pass in a positive sense through tangential sensing secondary winding 112 of magnetometer 102, thus cancelling any output due to this interfering field when the windings are connected in series opposition.

With magnetometers 100 and 102 arranged as shown, the outputs of the first and second channels will, therefore, form sine- and cosine-like outputs from which the angle of axle 20 and its angular rotational speed and acceleration can be calculated using well known electronic means. At the same time, the outputs will be free of all effects of a homogeneous, interfering, magnetic field.

Figure 3:
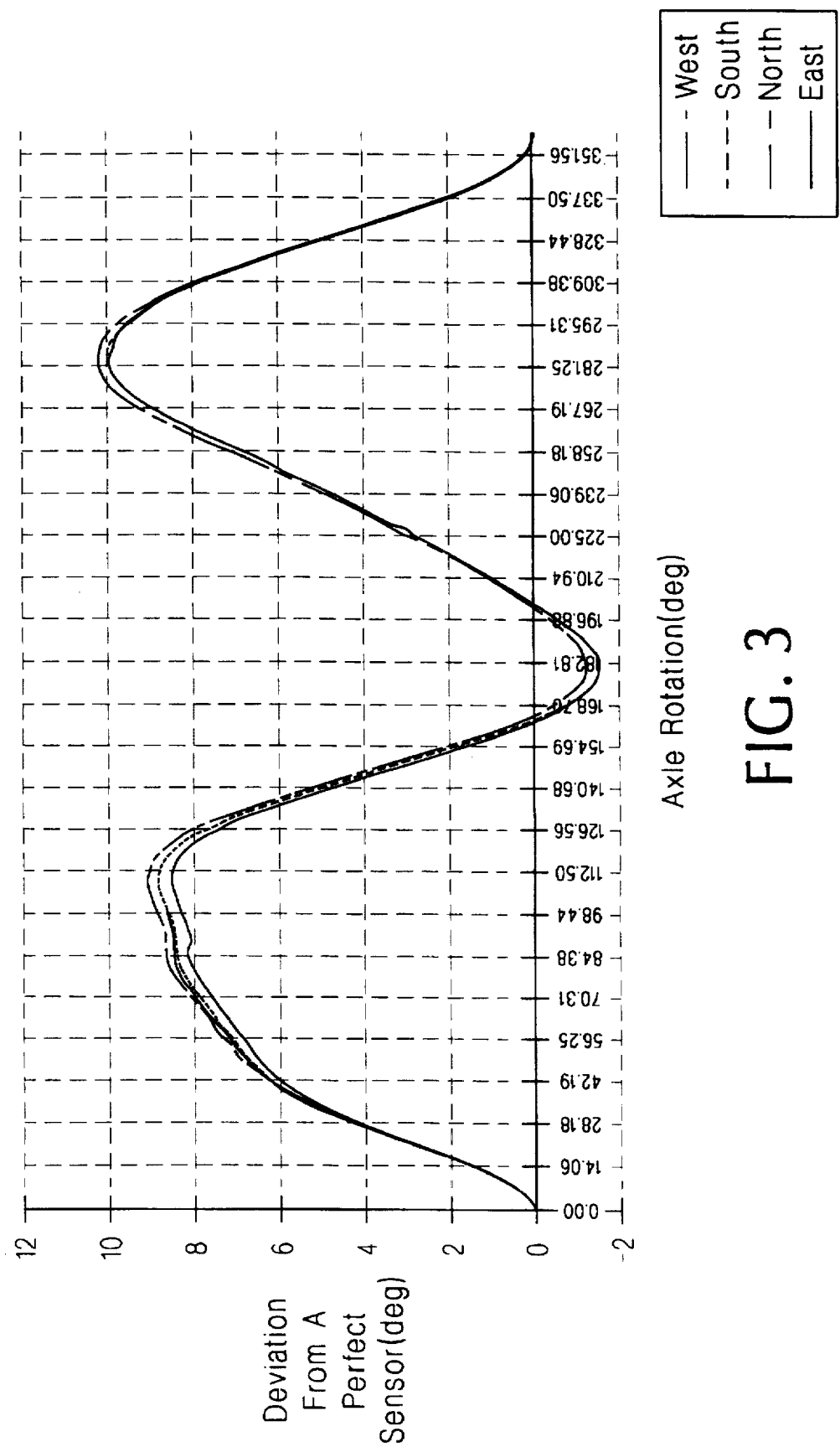
FIG. 3 is a chart illustrating the insensitivity of the present invention to geomagnetic orientation of an axle.

It will be understood that, whereas the preferred embodiment of the present invention has been described as utilizing fluxgate toroidal magnetometers as magnetic sensors, any directional magnetic sensor, such as Hall elements, may be utilized in the present invention, whether implemented in the mode shown on FIGS. 1-3 or the mode shown on FIGS. 5 and 6.

It will thus be seen that the objects set forth above, among those elucidated in, or made apparent from, the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

I claim:

1. A shaft rotation sensor, comprising:
   (a) first and second directional magnetic sensors, having first and second cores, respectively, angularly spaced apart from each other in a plane orthogonal to the axis of rotation of said magnetic source, such that said first sensor senses, and provides a first output representing, the magnitude of a first magnetic field component and said second sensor senses, and provides a second output representing, the magnitude of a second magnetic field component orthogonal to said first magnetic field component;
   (b) said first and second outputs being electrically connected in series to provide a first output channel;

(c) said first sensor also senses, and provides a third output representing, the magnitude of said second magnetic field component, and said second sensor also senses, and provides a fourth output representing, the magnitude of said first magnetic field component; and (d) said third and fourth outputs being electrically connected in series to provide a second output channel having an output orthogonal to the output of said first output channel as said rotating member rotates.

2. A shaft rotation sensor, as defined in claim 1, wherein: said first and second magnetic field vector components are two orthogonal field components formed from the tangential and radial field components.

3. A shaft rotation sensor, as defined in claim 1, wherein: said directional magnetic sensors comprise fluxgate magnetometers.

4. A shaft rotation sensor, as defined in claim 1, wherein: outputs from said first and second output channels have a sine/cosine relationship.

5. A method of sensing the rotation of a shaft, comprising:

(a) providing first and second directional magnetic sensors angularly spaced apart from each other with respect to a magnetic source on a rotating member in a plane orthogonal to the axis of rotation of said magnetic source, such that said first sensor senses, and provides a first output representing, the magnitude of a first magnetic field component and said second sensor senses, and provides a second output representing, the magnitude of a second magnetic field component orthogonal to said first magnetic field component, said first and second outputs being electrically connected in series to provide a first output channel;

(b) said first sensor also senses, and provides a third output representing, the magnitude of said second magnetic field component, and said second sensor also senses, and provides a fourth output representing, the magnitude of said first magnetic field component, said third and fourth outputs being electrically connected in series to provide a second output channel; and (c) measuring outputs from said first and second output channels to determine angular position, angular speed, and/or acceleration of said rotating member.

6. A method, as defined in claim 5, wherein: said first and second magnetic field vector components formed from the tangential and radial field components.

7. A method, as defined in claim 5, further comprising: providing said directional magnetic sensors as fluxgate magnetometers.

8. A method, as defined in claim 5, wherein: outputs from said first and second channels have a sine/cosine relationship.

* * * * *